United States Patent [19]

Taguri

[11] Patent Number: 5,754,886
[45] Date of Patent: May 19, 1998

[54] CONTROLLER FOR SUPPLYING MULTIPLEXED OR NON-MULTIPLEXED ADDRESS SIGNALS TO DIFFERENT TYPES OF DYNAMIC RANDOM ACCESS MEMORIES

[75] Inventor: Jun-ichi Taguri, Hadano, Japan

[73] Assignee: Hitachi, Ltd., Tokyo, Japan

[21] Appl. No.: 384,839

[22] Filed: Feb. 7, 1995

Related U.S. Application Data

[63] Continuation of Ser. No. 571,283, Aug. 23, 1990, Pat. No. 5,420,995.

[30] Foreign Application Priority Data

Aug. 29, 1989 [JP] Japan .................. 1-224270

[51] Int. Cl.$^6$ .................................. G06F 12/04
[52] U.S. Cl. .................. 395/886; 395/775; 395/284; 395/833; 395/421.01; 395/421.02; 395/412; 364/DIG. 1
[58] Field of Search .................. 395/425, 775, 395/284, 833, 421.01, 421.02, 412, 886; 364/DIG. 1

[56] References Cited

U.S. PATENT DOCUMENTS 4,633,392  12/1986  Vincent et al. .................. 395/284
4,882,727  11/1989  Williams et al. .................. 370/79
5,097,437   3/1992  Larson .................. 395/775

Primary Examiner—Tod R. Swann
Assistant Examiner—J. Peikari
Attorney, Agent, or Firm—Antonelli, Terry, Stout & Kraus, LLP

[57] ABSTRACT

A dynamic random access memory (RAM) addressing controller comprises a plurality of connectors connectible with a plurality of memory boards which use different addressing arrangements. A timing generator for generating a timing signal is provided for multiplexing address signals applied to a dynamic RAM storage. The controller also includes an input unit for applying an address signal of predetermined width, an address selector for mutliplexing a part of the address signal supplied from the input unit in accordance with the timing signal, a branching unit for supplying another part of the address signal of predetermined width from the input unit to a corresponding portion of each of the connectors respectively, and another branching unit for branching the address signal of the multiplexed part from the address selector in such a way as to be applied to a corresponding portion of each of the connectors. Memory boards carrying highly-integrated memory devices are replaceable in memory board slots.

3 Claims, 6 Drawing Sheets

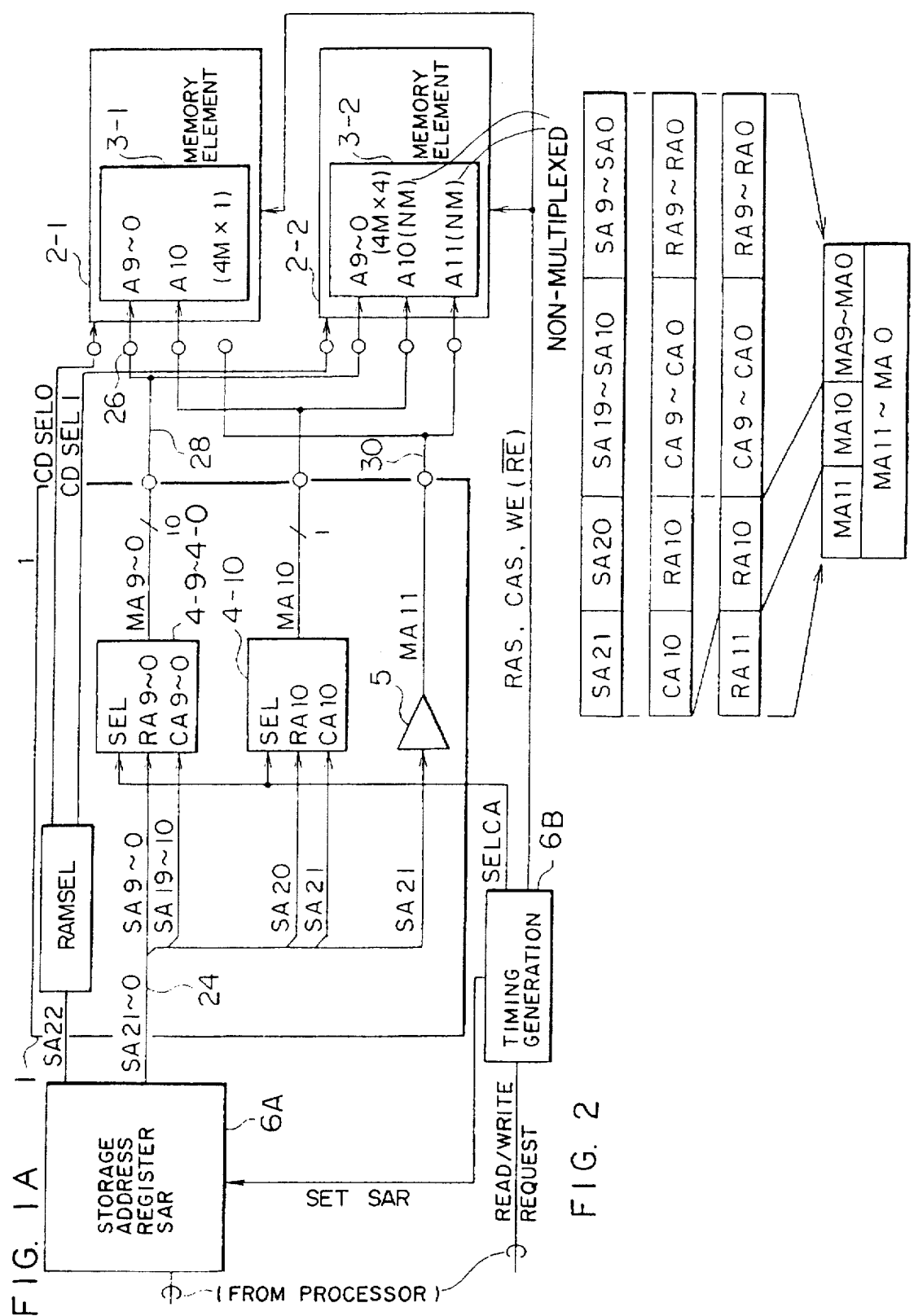

| TWO-MEMORY DEVICE CONFIGURATION | | SA | | | CDSEL | | SEL 16MW |
|---|---|---|---|---|---|---|---|
| | ID0-1 | 24 | 23 | 22 | 0 | 1 | |
| CASE 1 | 4M (ID0=0) | 0 | 0 | 0 | 1 | 0 | 0 |
| | 4M (ID1=0) | 0 | 0 | 1 | 0 | 1 | 0 |
| CASE 2 | 4M (ID0=0) | 0 | 0 | 0 | 1 | 0 | 0 |
| | 16M (ID1=1) | 0 | 0 | 1 | 0 | 1 | 1 |
| | | 0 | 1 | 0 | | | |
| | | 0 | 1 | 1 | | | |
| | | 1 | 0 | 0 | | | |
| CASE 3 | 16M (ID0=1) | 0 | 0 | 0 | 1 | 0 | 1 |
| | 4M (ID1=0) | 0 | 0 | 1 | | | |
| | | 0 | 1 | 0 | | | |
| | | 0 | 1 | 1 | | | |
| | | 1 | 0 | 0 | 0 | 1 | 0 |
| CASE 4 | 16M (ID0=1) | 0 | 0 | 0 | 1 | 0 | 1 |
| | 16M (ID1=1) | 0 | 0 | 1 | | | |
| | | 0 | 1 | 0 | | | |
| | | 0 | 1 | 1 | | | |
| | | 1 | 0 | 0 | 0 | 1 | 1 |
| | | 1 | 0 | 1 | | | |
| | | 1 | 1 | 0 | | | |
| | | 1 | 1 | 1 | | | |

CONTROLLER FOR SUPPLYING MULTIPLEXED OR NON-MULTIPLEXED ADDRESS SIGNALS TO DIFFERENT TYPES OF DYNAMIC RANDOM ACCESS MEMORIES

This is a continuation of application Ser. No. 571,238, filed Aug. 23, 1990, now U.S. Pat. No. 5,420,995.

BACKGROUND OF THE INVENTION

The present invention relates to a system for supplying an address to a memory unit.

The art of memory multiplexing, that is, supplying a row address and a column address by time division on an address bus to a memory matrix of a dynamic RAM is described in, for example, a Manual of Hitachi IC Memory, March 1990, pp. 91–92.

The U.S. Pat. No. 4,694,454 issued to Y. Matsuura on Sep. 15, 1987 discloses the refresh operation in a dynamic memory, which description is herein introduced by reference to the number thereof.

In a conventional dynamic memory device, as described in "Nikkei Micro-Devices", March 1989, p.p. 42–43, the refresh rate of 2048 cycles has been employed for the period of 32 ms for 16 megabits. In other words, the refreshing has been effected by division of $$(1/2)\sqrt{\text{memory capacity}}$$

in a predetermined length of time. This refresh rate is equivalent to 512 for a 1-megabit memory device, and 1024 for a 4-megabit memory device.

The 16-megabit memory device of what is called the next generation type has therefore a refresh cycle of 2048. With the increase in the number of bits activated or refreshed, however, the power consumption is undesirably increased for each cycle. In view of this, the recent tendency is toward reducing the number of bits activated for each cycle by increasing the refresh cycles to 4096 equivalent to $$\sqrt{\text{memory capacity}}.$$

In such a case, 12 bits ($PA_{0-11}$) of row address in the multiplex address line ($A_{0-11}$) supplied to the memory device represents a refresh address. As a result, a 16-megabit memory device having a configuration of 4 mega words×4 bits is addressed by 12 bits or row address ($RA_{0-11}$) and 10 bits of column address ($CA_{0-9}$). An address is thus supplied by ten bits of multiplex address line ($A_{0-9}$) and 2 bits of nonmultiplex address line ($A_{10-11}$).

A conventional 4-megabit memory device having a configuration of 4 megawords×one bit, on the other hand, is of a type of supplying an address by 11 bits of multiplex address line ($A_{0-10}$) since 2K×2K=4M as well known.

In other words, there are two types of memory device having the same address width, one supplied with an address partly nonmultiplexed but the remainder multiplexed, and the other supplied with all addresses multiplexed. Since alternation of generation of a memory chip used in a memory card is faster that the lifetime of the system, the parallel use of different types of cards is indispensable in order to steadily realize a higher performance of the system in operation.

In a conventional storage unit using the two types of memory devices in parallel, the problem is that the two types of memory devices are required to be discriminated and the storage addresses supplied to the memory address line are required to be controlled separately by switching in spite of the fact that they have the same address width.

SUMMARY OF THE INVENTION

Accordingly, it is an object of the present invention to provide a system for supplying an address to a memory address line without discriminating different methods of addressing for memory devices.

Another object of the present invention is to provide a memory control system in which a storage device is capable of being packaged with a desired combination of memory cards having different methods of supplying an address to a memory device but the same address width as well as memory cards having different address widths.

Still another object of the present invention is to provide an addressing system in which a scheme for memory board identification and addressing is determined when a memory board is set in the slot of an information processing system.

A further object of the present invention is to provide an addressing system by which slots for arranging a plurality of dynamic RAM boards having different address supply schemes are selectable as desired.

In order to achieve the above-mentioned objects, there is provided according to the present invention an address supply system for a memory unit using first and second memory devices having the same address width but different supply methods, wherein the first memory device has an N-bit multiplex address input, and the second memory device an N-M bit multiplex address input and first and second M-bit nonmultiplex address inputs wherein, the same storage address is supplied, in a multiplexed manner by time division: (1) to the address line connected with the M-bit multiplex address input of the first memory device and the first M-bit nonmultiplex address input of the second memory device and (2) to the address line connected with the second M-bit nonmultiplex address input of the second memory device.

The storage address supplied in a multiplexed manner as described above is applied to the first and second memory devices through a selector as well as, and to the second memory device without the use of a selector.

The selector uses a control signal to produce multiplexed row and column addresses selectively from a plurality of storage addresses.

A third memory device having an (N+M) bit multiplex address input is also mounted on the card. In addition the multiplex address input of M×2 bits of the third memory device and the first and second M-bit nonmultiplex address input of the second memory device are connected to a common address line.

The M-bit multiplex address input of the third memory device and the second M-bit nonmultiplex address input of the second memory device are provided with a second selector for selectively supplying an address. The system also comprises means for discriminating the first, second and third memory devices, so that the outputs of the second selector are switched by the output of the discriminating means.

The discriminating means includes means for generating a first-level potential when the first and second memory devices are mounted on the memory card, and means for generating a second-level potential when the third memory device is mounted on the same card. The potential-generating means may be a register for setting memory device discriminating information in advance.

The first memory device, which is configured of 4 MW×1 bit, is supplied with a storage address ($SA_{21-0}$), that is, row addresses ($RA_{9-0}$), ($RA_{10}$) and column addresses ($CA_{9-0}$), ($CA_{10}$) in a multiplexed manner by way of the memory address line ($MA_{10-0}$).

The second memory device, configured of 4 MW×4 bits, is similarly connected to the memory address line ($MA_{10-0}$) but is not supplied with the storage address ($SA_{21}$) since the address input ($A_{10}$) connected to the memory address line ($MA_{10}$) having a multiplexed storage address of ($SA_{20}$) and ($SA_{21}$) is a nonmultiplex address input.

In view of the fact that the storage address ($SA_{21}$) making up the row address ($RA_{11}$) is supplied to the nonmultiplex address input ($A_{11}$) of the second memory device by way of another memory address line ($MA_{11}$), however, the second memory device is also supplied with the storage address ($SA_{21-0}$).

BRIEF DESCRIPTION OF THE DRAWINGS

FIGS. 1A, 1B and 2 are diagrams showing a circuit, an address concept and a flowchart respectively of an address supply system according to a first embodiment of the present invention.

DESCRIPTION OF THE PREFERRED EMBODIMENTS

Figure 1B:
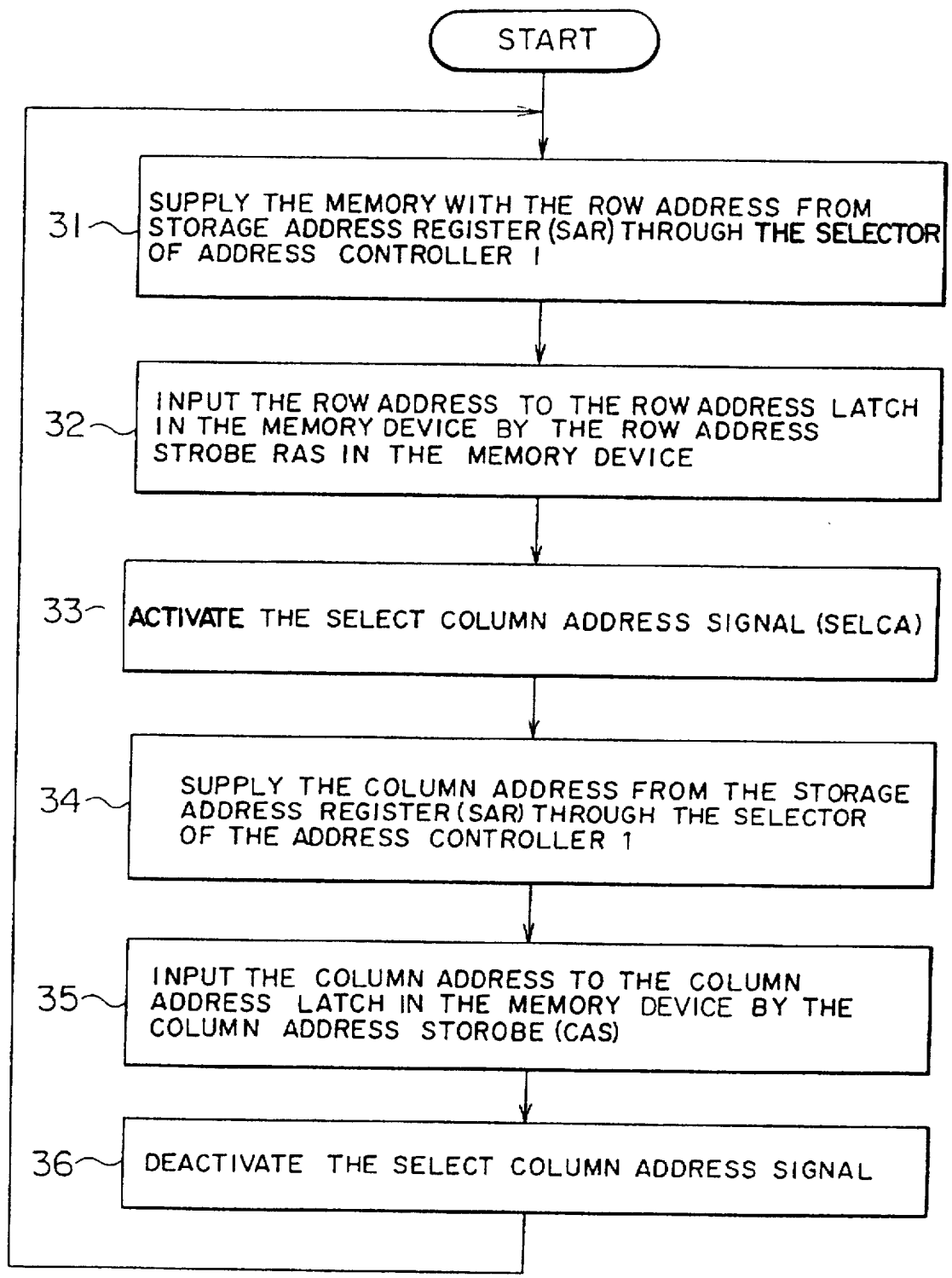

An embodiment of the present invention will be described below with reference to the accompanying drawings.

In all the drawings used for explaining embodiments, those component parts having the same function are designated by the same reference numerals respectively, and will not be repeatedly described.

(Embodiment 1)

An address supply system according to a first embodiment of the present invention is shown in FIGS. 1A, 1B and 2. An address control section 1 controls the supply of a storage address ($SA_{21-0}$) from a storage address register 6A to a memory card 2-1 having mounted thereon a 4-megabit dynamic memory device 3-1, having a configuration of 4 megawords×1 bit with an 11-bit address input in multiplex form, and a memory card 2-2, having mounted thereon a 16-megabit dynamic memory device 3-2 having a configuration of 4 megawords×4 bits with a multiplexed 10-bit address input ($A_{9-0}$) and a nonmultiplexed 2-bit address input ($A_{11-10}$).

The memory card 2-1 has mounted thereon 72 memory devices 3-1, and the memory card 2-2 has memory devices 3-2, each providing a memory card of 4-megawords×72 bits having a functional compatibility.

The operation shown in FIG. 1B is performed. The address control section 1 multiplexes the storage addresses ($SA_{9-0}$) and ($SA_{19-10}$) by selectors SEL (4-9 to 4-0), and the storage address ($SA_{20}$ and $SA_{21}$) by the selector SEL (4-10). Specifically, first, the storage address ($SA_{9-0}$) making up a row address ($RA_{9-0}$) is supplied to the memory address line ($MA_{9-0}$) (blocks 31, 32), followed by the storage address ($SA_{20}$) making up a row address ($SA_{10}$) being supplied to the memory address line ($MA_{10}$). As the next step, a select column address signal (SELCA) from a timing generation circuit 6B is activated (block 33), and then the storage addresses ($SA_{19-10}$) and ($SA_{21}$) making up the column addresses ($CA_{9-0}$) and ($CA_{10}$) are supplied to the memory address lines ($MA_{9-0}$) and ($MA_{10}$), respectively (blocks 34, 35). The select column address signal (SELCA) is nonactivated (block 36). Further, the storage address ($SA_{21}$) is supplied to the memory address line ($MA_{11}$) through a buffer gate 5.

The memory card 2-1 connected to the memory address line ($MA_{11-0}$) fetches and connects the signal on the memory address line ($MA_{10-0}$) to the address input ($A_{10-0}$) of the memory device 3-1, while the memory card 2-2 fetches and connects the memory address line ($MA_{11-0}$) to the address input ($A_{11-0}$) of the memory device 3-2. The column and row addresses in the selectors 4-9 to 4-0 and 4-10 are switchable in accordance with the change in SELCA signal.

This configuration permits the memory device 3-1 of the memory card 2-1 to be supplied with the storage address ($SA_{21-0}$), that is, the row addresses ($RA_{9-0}$), ($RA_{10}$) and the column addresses ($CA_{9-0}$), ($CA_{10}$), in multiplexed form by way of the memory address line ($MA_{10-0}$).

Also, the memory address line ($MA_{10-0}$) is similarly connected to the memory device 3-2 of the memory card 2-2. Since the address input ($A_{10}$) connected to the memory address line ($MA_{10}$) having storage address ($SA_{20}$) and ($SA_{21}$) multiplexed with each other is an element operated as a nonmultiplex (NM) input, however, the storage address ($SA_{21}$) is not latched to the latch in the memory device in the memory card 2-2.

In view of the fact that the storage address ($SA_{21}$), by way of the buffer gate 5, is supplied also to the nonmultiplex (NM) address input ($A_{11}$) of the memory device 3-2, however, the storage address ($SA_{21-0}$) may be supplied also to the memory device 3-2. As a result, the memory cards 2-1 and 2-2 have a compatibility in slot position.

FIG. 2 shows the correspondence between the storage addresses and the row and column addresses supplied to the memory devices.

As is obvious from this diagram, ($SA_{21}$) is supplied in multiplexed form to ($CA_{10}$) and ($PA_{11}$), that is, to ($MA_{10}$) and ($MA_{11}$), so that the address control section 1 is not required to switch the address supply route by discriminating the memory devices 3-1 and 3-2 from each other, in spite of the difference in the systems of address supply from the address latch therein to the memory devices.

(Embodiment 2)

Figure 3:
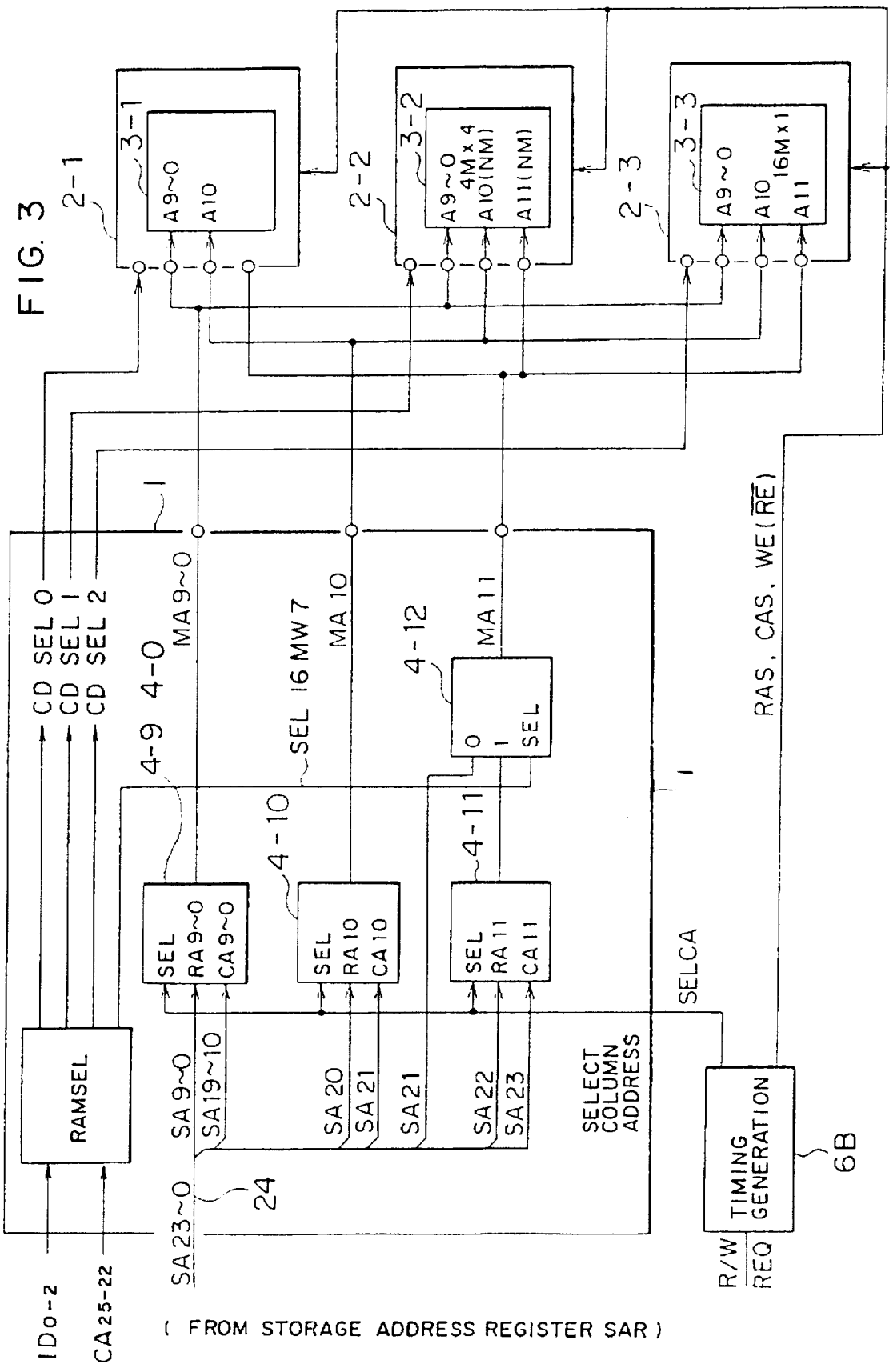
FIG. 3 and FIG. 4 are diagrams showing an address supply system according to a second embodiment of the present invention.
Figure 4:
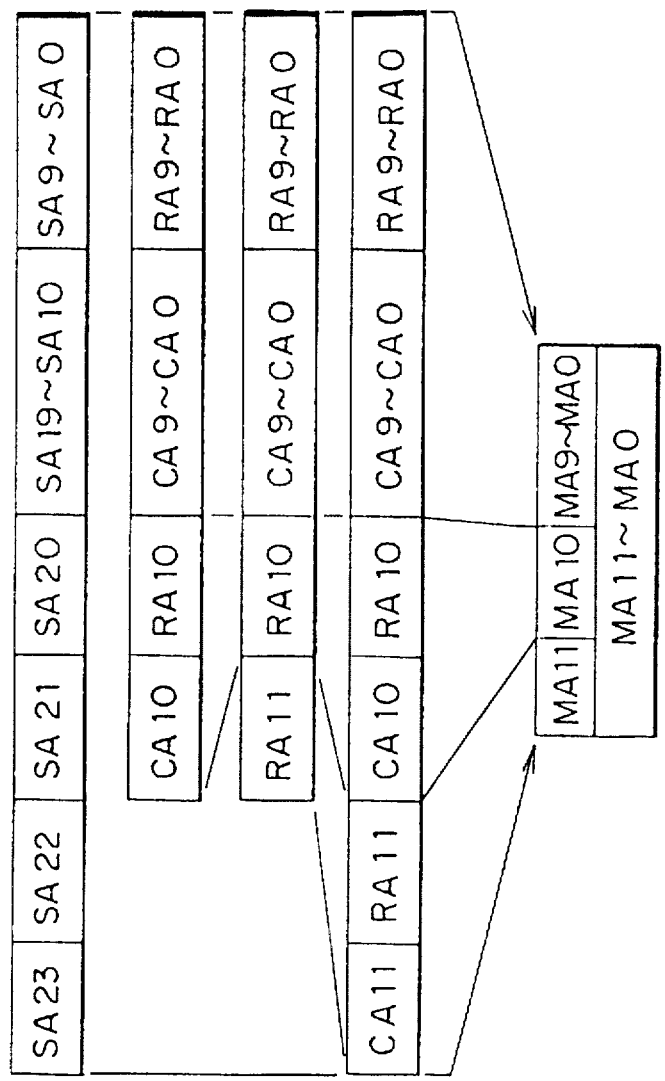

FIGS. 3 and 4 show an embodiment in which a storage address is capable of being supplied also to the memory card 2-3 having mounted thereon the 16-megabit dynamic memory device 3-3 having a configuration of 16 megawords×1 bit with 12 bits of address input ($A_{11-0}$) in addition to the memory cards 2-1, 2-2.

The memory card 2-3 has mounted thereon 72 memory devices 3-3, and configured of 16 megawords×72 bits with an address space four times as that of large as the memory cards 2-1, 2-2.

The embodiment shown in FIG. 3 further comprises a selector SEL (4-11) for multiplexing the storage addresses ($SA_{22}$) and ($SA_{23}$) and a selector SEL (4-12) capable of selecting and producing as an output one of the storage addresses ($SA_{21}$) and the two inputs of the selector SEL (4-11).

In the case where an address is supplied to the memory cards 2-1 and 2-2, a 16-megaword memory card select signal (SEL 16 MW) 7 is set to logical value 0, so that the selector SEL (4-12) selects and produces a storage address ($SA_{21}$), thereby making up an address supply system according to the Embodiment 1 mentioned above.

In the case where an address is supplied to the memory card 2-3, the select signal (SEL 16 MW) 7 is set to logical value 1, whereby the selector SEL (4-12) selects and produces the output of the selector SEL (4-11). As a result, the storage address ($SA_{21-0}$) is supplied to the memory card 2-3 by the memory address line ($MA_{10-0}$), and the storage address ($SA_{23-22}$) by the memory address line ($MA_{11}$).

FIG. 4 is a diagram showing the correspondence between the storage addresses and the row and column addresses supplied to the memory devices.

According to a second embodiment of the present invention, a storage address is capable of being supplied also to the memory card 2-3 having an address space four times as large, and two bits more in the number of address bits, than the memory cards 2-1, 2-2.

(Embodiment 3)

Figures 5, 6:
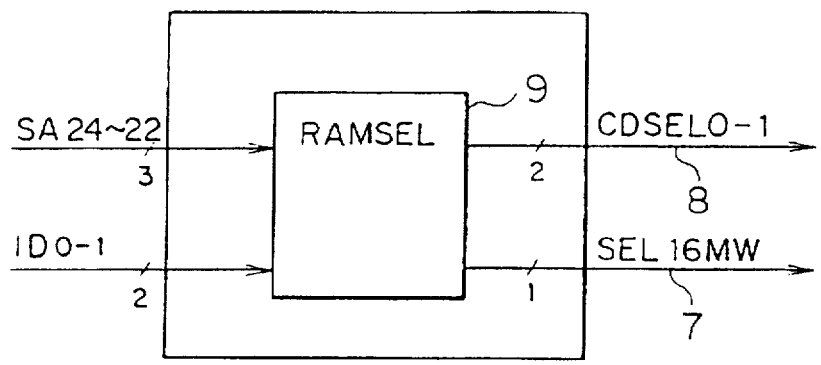
FIG. 5 is a diagram showing a memory device selector circuit according to the present invention.
FIG. 6 is a truth table showing the operation of the device in FIG. 5.

FIG. 5 is a diagram showing a memory device selector circuit 9 included in the address control section 1 for generating a select signal (SEL 16 MW) 7 for controlling the selector SEL (4-12) shown in FIG. 3 and the memory card select signal ($CDSEL_{0-1}$) 8 in a memory unit having two given cards mounted in the memory cards 2-1, 2-2 and 2-3. The number of the memory card selection signal lines coincides with the quotient of the number of the memory cards mounted on the system to the number of the memory cards selected, simultaneously, and has a logic value of "0" or "1". The logic value "0" is set in the memory card identifying information ($ID_{0-1}$) when the memory card 2-1 (4 Mbits) or 2-2 (4 Mbits) is mounted on the memory unit, and the logic value "1" therein when the memory card 2-3 (16 Mbits) is mounted. The card select signal is supplied by a decoder from the signals $ID_{0-1}$ and SA 24-22. The signal $ID_{0-1}$ will be described later. When the two cards are both 4 megabits, for example, the memory card ID information bits ($ID_{0-1}$) are both zero, while if the card (0) is 16 Mbits and the other card (1) is 4 Mbits, $ID_0=1$ and $ID_1=0$.

The memory card select signal ($CDSEL_{0-1}$) 8 and the select signal (SEL 16 MW) 7 as shown in FIG. 6 are generated by the above-mentioned memory card identifying information ($ID_{0-1}$) and the storage address ($SA_{24-22}$) for accessing the memory unit.

Specifically, in the case where the memory card identifying information ($ID_0$ or $ID_1$) is "0" in logic value, the memory card select signal $CDSEL_0$ or $CDSEL_1$ becomes "1" in logic value against a memory card including one address designated by the storage address ($SA_{24-22}$) corresponding to the particular memory card. If the memory card identifying information is "1" in logic value, on the other hand, the memory card select signal becomes "1" in logic value against the four addresses designated by the storage address ($SA_{24-22}$) corresponding to the particular memory card.

This memory card select signal ($CDSEL_0$, $CDSEL_1$) is supplied to each of the two memory cards (FIG. 8) thereby permitting exclusive selection of a memory card.

The select signal (SEL 16 MW) 7, on the other hand, becomes "1" in logic value when the memory card identifying information designates the address of the memory card 2-3 of logic "1", and "0" in logic value when the address of the memory card 2-1 or 2-2 of logic value "0" is designated. As a result, if the selector SEL (4-12) shown in FIG. 3 is controlled by this select signal (SEL 16 MW) 7, the desired storage address may be supplied to the memory cards 2-1, 2-2 and 2-3.

Figure 7:
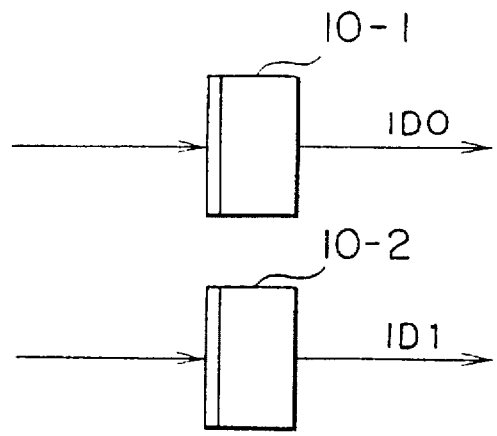
FIG. 7 is a diagram showing an embodiment for generating memory card discriminating information according to the present invention.
Figure 8:
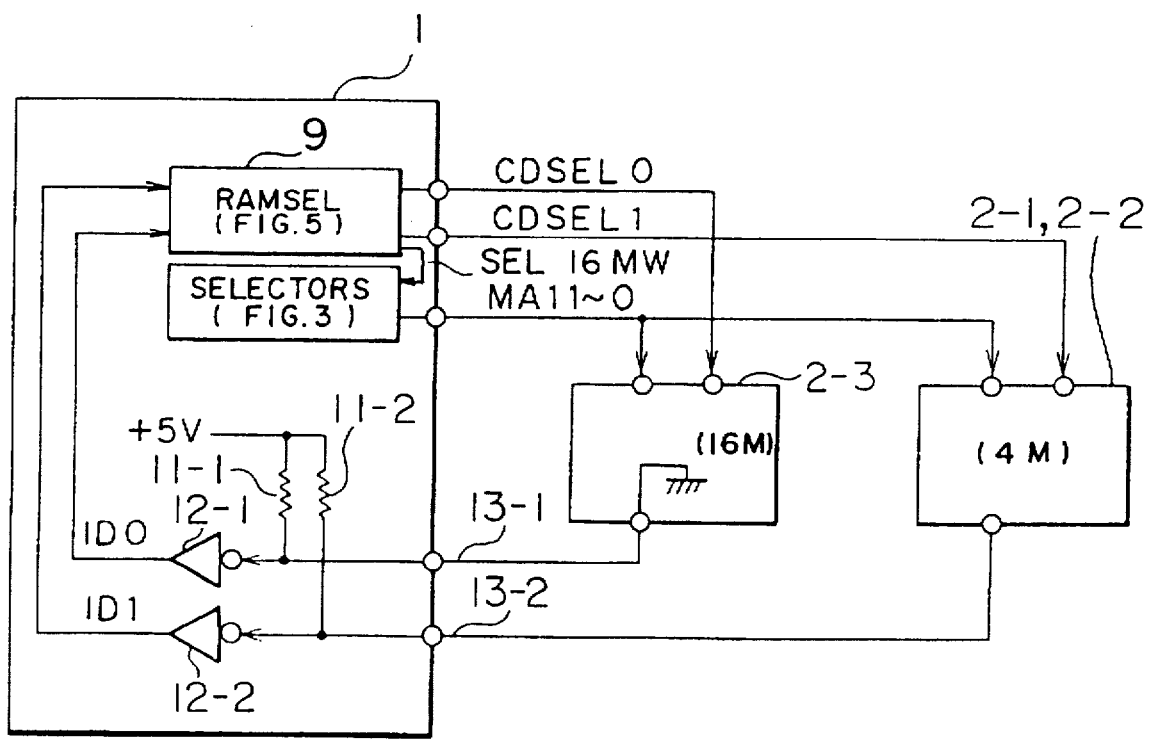
FIG. 8 is a diagram showing another embodiment for generating memory card discriminating information according to the present invention.

FIGS. 7 and 8 are diagrams showing a method of generating memory card identifying information ($ID_{0-1}$) according to the present invention.

In FIG. 7, the memory card identifying information is set beforehand in the registers 10-1 and 10-2 capable of scan-in from a service processor in correspondence with the memory card mounted on the memory unit, thereby supplying the memory card identifying information ($ID_{0-1}$) to the memory device selector circuit 9 of FIG. 5.

FIG. 8 shows a method of supplying the memory card identifying information to the address control section 1 from the memory cards 2-3 and 2-1 or 2-2, unlike the arrangement shown in the embodiment shown in FIG. 7. In the embodiment of FIG. 8, the memory card 2-3 grounds the information line 13-1 while the memory card 2-1 or 2-2 opens the information line 13-2. In the address control section 1, these two information lines are connected to a +5V power supply through resistors 11-1 and 11-2, and an ($ID_{0-1}$) signal is supplied to the memory device selector circuit 9 in FIG. 5 through inverters 12-1 and 12-2.

The method shown in FIG. 8 eliminates the need of prior setting of the memory card identifying information in the register 10 from the processor, but the setting is automatically possible by mounting a memory card on the memory unit.

I claim:

1. An address supply system for supplying addresses to first and second memory devices connected thereto where said first and second memory devices have the same address width, said first memory device includes a first N-bit multiplex address input, and said second memory device includes a second N minus M bit multiplex address input, a third M-bit nonmultiplex address input, and a fourth M-bit nonmultiplex address input, said address supply system comprising:

(a) a fifth N minus M bit terminal for supplying an N minus M bit multiplex address;

(b) a sixth M bit terminal for supplying a M bit multiplex address to said first memory device or for supply a M bit nonmultiplex address to said second memory device;

(c) a seventh M bit terminal for supplying an M bit nonmultiplex address; and (d) an address controller inputting and converting a 2N bit address and outputting said converted address to said fifth N minus M bit terminal, and said sixth M bit terminal or said seventh M bit terminal;

wherein said N bit multiplex address from both said fifth N minus M bit terminal and said sixth M bit terminal is supplied to said first N-bit multiplex address input when said first memory device is connected to said address supply system, and wherein said multiplex address from said fifth N minus M bit terminal is supplied to said second N minus M bit multiplex address input, said M bit nonmultiplex address from said sixth M bit terminal is supplied to said third M-bit nonmultiplex address input, and said nonmultiplex address from said seventh M bit terminal is supplied to said fourth M-bit nonmultiplex address input when said second memory device is connected to said address supply system.

2. An address supply system for supplying addresses to a plurality of memory devices having mutually different address widths, where each of said plurality of memory devices has an address input terminal and an address-width output terminal for providing an address-width indication signal indicating an address width of the memory device, said address supply system comprising:

an address-width receiving terminal connected to at least one of said address-width output terminals of one of said memory devices for receiving said address-width indication signal from said one of said memory devices;

address conversion means for converting an address inputted to said address supply system into an address having a width coincident with said address width indicated by said address-width indication signal from said one of said memory devices; and an address supply terminal, connected to said address input terminal of said one of said memory devices, for outputting said address obtained in said address conversion means to said one of said memory devices.

3. An address supply system for supplying addresses to a plurality of memory devices having mutually different address widths, where each of said plurality of memory devices has an address input terminal and an address-width output terminal for providing an address-width indication signal indicating an address width of the memory device, said address supply system comprising:

one or more address-width receiving terminals connected to said address-width output terminals of said memory devices for receiving said address-width indication signal from said memory devices;

address conversion means for converting addresses inputted to said address supply system into an address having widths coincident with said address widths indicated by said address-width indication signals from said memory devices; and one or more address supply terminals, connected to said address input terminals of said memory devices, for outputting said addresses obtained in said address conversion means to said memory devices, such that each of said memory devices will be addressed with an address from said one or more address supply terminals which address has the correct address width for the memory being addressed.

* * * * *